US012545976B2

(12) United States Patent
Van Heerden et al.

(10) Patent No.: US 12,545,976 B2
(45) Date of Patent: Feb. 10, 2026

(54) ALUMINUM-SCANDIUM COMPOSITE, ALUMINUM-SCANDIUM COMPOSITE SPUTTERING TARGET AND METHODS OF MAKING

(71) Applicant: MATERION CORPORATION, Mayfield Heights, OH (US)

(72) Inventors: David Peter Van Heerden, Mayfield Heights, OH (US); Katharine S. Gardinier, Mayfield Heights, OH (US); Robert S. Bailey, Mayfield Heights, OH (US)

(73) Assignee: MATERION CORPORATION, Mayfield Heights, OH (US)

( * ) Notice: Subject to any disclaimer, the term of this patent is extended or adjusted under 35 U.S.C. 154(b) by 527 days.

(21) Appl. No.: 18/000,180

(22) PCT Filed: Jun. 3, 2021

(86) PCT No.: PCT/US2021/035627

§ 371 (c)(1),
(2) Date: Nov. 29, 2022

(87) PCT Pub. No.: WO2021/247813

PCT Pub. Date: Dec. 9, 2021

(65) Prior Publication Data

US 2023/0203622 A1 Jun. 29, 2023

Related U.S. Application Data

(60) Provisional application No. 63/035,320, filed on Jun. 5, 2020.

(51) Int. Cl.

*C22C 1/04* (2023.01)
*C22C 1/047* (2023.01)

(Continued)

(52) U.S. Cl.

CPC ............ *C22C 1/0416* (2013.01); *C22C 1/047* (2023.01); *C22C 21/00* (2013.01); *C23C 14/3414* (2013.01)

(58) Field of Classification Search

None

See application file for complete search history.

(56) References Cited

U.S. PATENT DOCUMENTS 3,619,181 A 11/1971 Willey
4,689,090 A 8/1987 Sawtell et al.

(Continued)

FOREIGN PATENT DOCUMENTS

CN 104805406 A 7/2015
CN 105886850 A 8/2016

(Continued)

OTHER PUBLICATIONS

English translation of CN 110983262 (originally published Apr. 10, 2020), obtained from PE2E search.*

(Continued)

*Primary Examiner* — George Wyszomierski
(74) *Attorney, Agent, or Firm* — COZEN O'CONNOR

(57) ABSTRACT

An Al—Sc alloy sputtering target. The target comprising from 1.0 at % to 65 at % scandium and from 35 at % to 99 at % aluminum and having a microstructure including a first aluminum matrix phase and a second phase dispersed uniformly therethrough. The second phase comprises one or more compounds corresponding to the formula $Sc_xAl_y$, where x is from 1 to 2 and y is from 0 to 3.

22 Claims, 5 Drawing Sheets

(51) Int. Cl.

| | |
|---|---|
| ***C22C 21/00*** | (2006.01) |
| ***C23C 14/34*** | (2006.01) |

(56) References Cited

U.S. PATENT DOCUMENTS

| | | | | |
|---|---|---|---|---|
| 6,010,583 | A | 1/2000 | Annavarapu et al. | |
| 6,329,275 | B1 | 12/2001 | Ishigami et al. | |
| 9,127,334 | B2 | 9/2015 | Pandey | |
| 9,644,249 | B2 | 5/2017 | Haidar | |
| 11,236,416 | B2 | 2/2022 | Morii et al. | |
| 2008/0178593 | A1 * | 7/2008 | Yang | B22D 25/06 164/45 |
| 2009/0263276 | A1 * | 10/2009 | Pandey | C22F 1/047 148/552 |
| 2012/0000766 | A1 | 1/2012 | Teshigahara et al. | |
| 2014/0174908 | A1 | 6/2014 | Feng et al. | |
| 2017/0165795 | A1 | 6/2017 | Lenczowski | |
| 2018/0094340 | A1 * | 4/2018 | Ferrasse | H01J 37/3435 |
| 2018/0261439 | A1 | 9/2018 | Myasnikov et al. | |
| 2019/0161851 | A1 * | 5/2019 | Morii | C22C 28/00 |

FOREIGN PATENT DOCUMENTS

| | | | | |
|---|---|---|---|---|
| CN | 110562936 | A | | 12/2018 |
| CN | 109161858 | A | | 1/2019 |
| CN | 110093588 | A | | 8/2019 |
| CN | 110904364 | A | | 3/2020 |
| CN | 110983262 | A | * | 4/2020 |
| EP | 3467142 | A1 | | 4/2019 |
| JP | 2002212717 | A | | 7/2002 |
| JP | 2010204291 | A | | 9/2010 |
| JP | 2015-096647 | A | | 5/2015 |
| JP | 2017-186646 | A | | 10/2017 |
| KR | 2015-0145146 | A | | 12/2015 |

OTHER PUBLICATIONS

English translation of JP 2015096647 (originally published May 21, 2015), obtained from PE2E search.*

Marquis, E.A. et al., "Nanoscale Structural Evolution of Al3Sc Precipitates in Al(Sc) Alloys", Acto Materialia, vol. 49, pp. 1909-1919, Mar. 7, 2001.*

International Application No. PCT/US2021/035627, "International Search Report", mailed Aug. 17, 2021, 3 pages.

* cited by examiner

ALUMINUM-SCANDIUM COMPOSITE, ALUMINUM-SCANDIUM COMPOSITE SPUTTERING TARGET AND METHODS OF MAKING

CROSS-REFERENCE

This application is a national stage application of PCT/US2021/035627 filed on Jun. 3, 2021, published as International Publication No. WO 2021/247813 A1 on Dec. 9, 2021, which is related to and claims priority to U.S. Provisional Application No. 63/035,320, filed Jun. 5, 2020; the entirety of which is are incorporated herein by reference.

FIELD

The present disclosure relates to alloys containing aluminum and scandium (Al—Sc alloys) and, more particularly, uses for such Al—Sc alloys and to articles and sputtering targets made therefrom.

BACKGROUND

Aluminum scandium nitride ($Al_xSc_{1-x}N$) is of some interest for the fabrication of thin film piezoelectric materials for various applications. A conventional method for manufacturing these piezoelectric thin films is by using reactive sputter deposition. The sputtering target, typically a metal or metallic alloy, is constructed of the material to be sputtered. The sputtering target and the substrate are placed in proximity to one another within the chamber and the target is bombarded with charged particles or ions. The high energy ions cause a portion of the sputtering target to dislodge and be re-deposited on the substrate. Sputtering is advantageous because it allows compositional control of the film, affords control of residual stresses in the film, allows high rate deposition of the thin film, and readily accommodates controlled heating of the substrate. There is already a strong history of using this process in fabricating thin films.

The resulting properties of the thin films depend strongly on uniform deposition of the Al—Sc alloy. This imposes considerable demands on the properties of the sputtering targets and the alloys. The piezoelectric response of the thin film is strongly dependent upon the scandium content of the film, and so the overall chemical stoichiometry and macro-distribution of the scandium in the sputtering target is critical.

Even in view of the known alloys and sputtering targets, the need exists for alloys and sputtering targets that provide for improvements in uniformity of chemical stoichiometry and minimization of porosity. The need further exists for a microstructure that reduces target failure due to cracking and contamination from particle emission during sputtering (particles being ejected from the surface of the sputtering target, rather than individual atoms/ions, and landing on the wafer—often referred to as particulation). These features may contribute to a sputtering target having better performance and lifetime resulting in higher wafer yields and lower cost of ownership.

SUMMARY

In one embodiment, the disclosure relates to an Al—Sc composite or sputtering target comprising from 1.0 at % to 65 at % scandium and from 35 at % to 99 at % aluminum, having a microstructure including (5 vol % to 99 vol %, e.g., 20 vol % to 99 vol % of) a first phase and (from 1 vol % to 80 vol % of) a second phase dispersed therethrough, the second phase comprising a compound corresponding to the formula $Al_xSc_y$, where x is from 0 to 3 and y is from 1 to 2. The second phase may comprise $ScAl_3$, $ScAl_2$, ScAl, $Sc_2Al$, or Sc, or combinations thereof or may comprise $ScAl_2$, ScAl, $Sc_2Al$, or Sc, or combinations thereof. The second phase may comprise greater than 25 at % scandium and/or greater than 1 mol % of $Al_2Sc$, AlSc, $AlSc_2$, or Sc, or combinations thereof, and/or less than 85 mol % aluminum, and/or from 1.0 mol % to 70 mol % scandium nitride. The concentration of scandium in the second phase may be greater than, e.g., at least 1% greater than, the concentration predicted by the equilibrium phase diagram for aluminum-scandium. The composite or sputtering target may further comprise less than 1000 ppm of oxygen, preferably less than 400 ppm, or more preferably less than 100 ppm. Grains of the first aluminum matrix phase may be characterized by a crystallographic orientation of (110) or by a random crystallographic orientation. The second phase may be characterized as having a particle size ranging from 0.5 microns to 500 microns. The microstructure is substantially devoid of microcracks and fissures and/or oxide inclusions. The uniformity of scandium across a surface of the sputtering target may vary by less than +/−0.5 at % scandium over an entire radius of the surface. The sputtering target may have a central axis and a diameter intersecting the central axis through a thickness of the sputtering target, and the uniformity of scandium across the central axis and the diameter varies by less than +/−0.5 wt % scandium. The diameter may be greater than 300 mm.

In some embodiments, the disclosure relates to a process for producing a non-equilibrium composite, the process comprising: providing a second phase powder comprising a compound corresponding to the formula $Al_xSc_y$, where x is from 0 to 3 and y is from 1 to 2; mixing the powder with a first phase comprising aluminum to form a composite precursor; applying at least one of heat or pressure to the composite precursor to consolidate the materials and cooling the consolidated composite precursor to form the non-equilibrium composite.

BRIEF DESCRIPTION OF THE DRAWINGS

A further understanding of the nature and advantages of the disclosed technology may be realized by reference to the remaining portions of the specification and the drawings.

DETAILED DESCRIPTION

Figure 1:
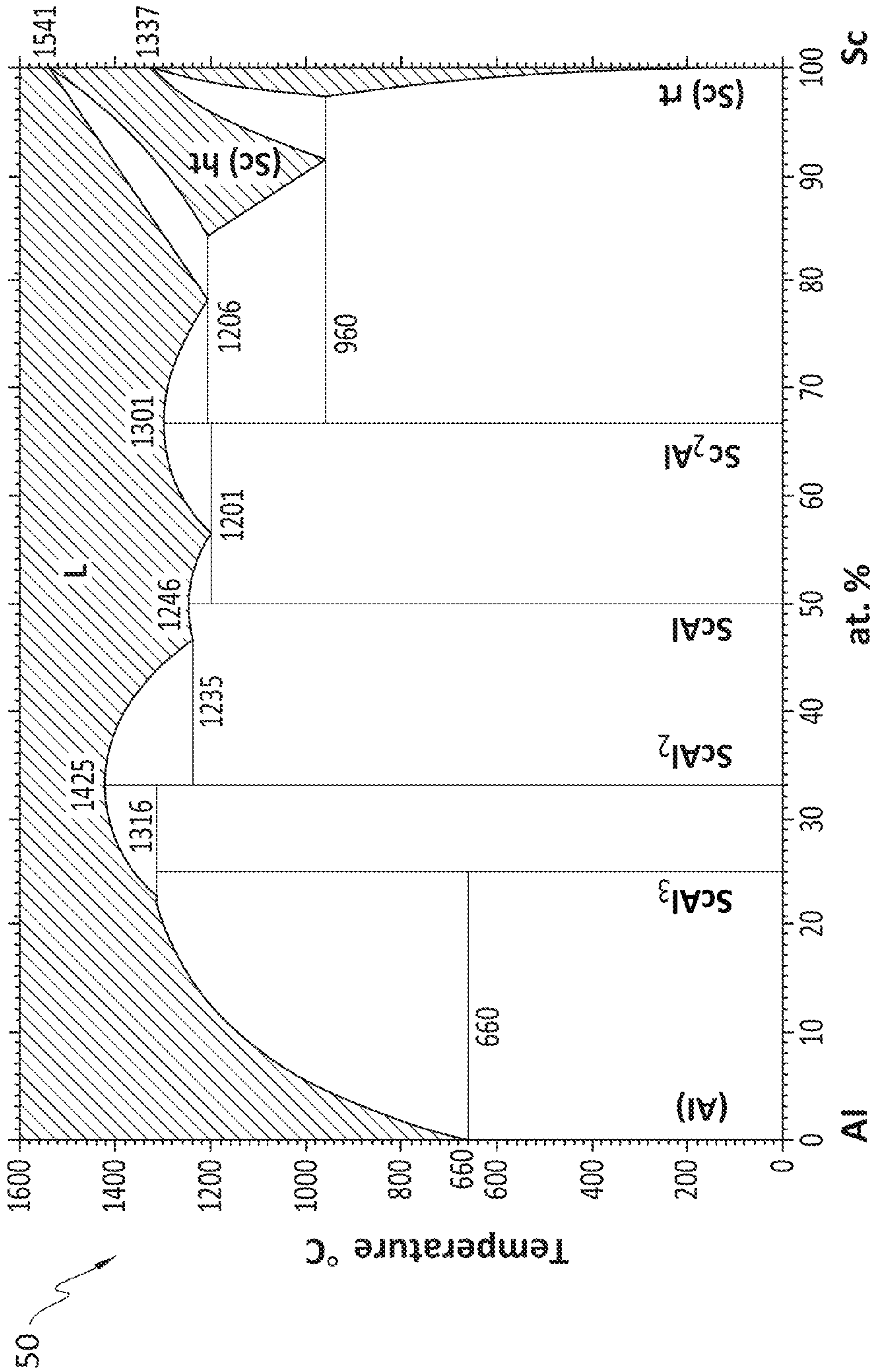
FIG. 1 is a phase diagram for aluminum and scandium. The y-axis is temperature (° C.) and runs from 0° C. to 1600° C. at intervals of 200° C. The y-axis also includes a notation at 660° C., the melting point of aluminum.

As discussed above, aluminum-scandium alloys produced using many conventional processes do not meet the demands for a uniform chemical stoichiometry and minimal porosity, and a defect-free microstructure. As a result, the films and substrates formed therefrom have inconsistencies in thin film uniformity. Also, the targets comprising the alloys suffer from deficiencies in physical/mechanical performance such as having defects leading to cracks which can cause arcing or particulation during sputtering, leading to yield losses and reduced target lifetime. The industry desires targets that are defect free, that prevent target cracking, that demonstrate low particle emission during sputtering, and that provide extended target lifetime.

Aluminum—Scandium Composites

Non-equilibrium composites, e.g., for use as sputtering targets, comprising a ductile, first phase and a brittle second phase are disclosed herein. The use of particular second phases, e.g., (brittle) intermetallic $Al_xSc_y$ phases, (in specific amounts) in the non-equilibrium composites has been found to provide microstructures that maximize the amount of ductile aluminum phase and minimize the amount of brittle intermetallic $Al_xSc_y$ phases, while maintaining the overall composition percentages in the composite. This provides for desirable combinations of the features mentioned above, e.g., uniformity in bulk composition of the aluminum-scandium alloy as well as a defect and porosity-free microstructure, as well as prevention of target cracking and reduction of casting defects and particle emission. In some cases, a desirable increase of the ductile phase content is achieved by employing lower amounts of intermetallic $Al_xSc_y$ phases that have higher scandium content and/or lower amounts of aluminum (outside of the amounts predicted by the equilibrium phase diagram for aluminum-scandium). Thus, because lower amounts of intermetallic $Al_xSc_y$ phases are employed, it is possible to utilize higher amounts of ductile aluminum phase, which provides for the aforementioned benefits.

As noted above, the addition of the metastable ductile phase, e.g., "free aluminum," to the microstructure may reduce particulation and improve the overall performance of the target. In addition, the added ductility offered by the ductile phase facilitates thermomechanical processing of these materials. This allows the healing of casting defects such as solidification pores and inhomogeneous microstructures. It also reduces arcing and improves consistency of the sputter performance over the life of the target. Also, thin films made using the sputtering targets disclosed herein advantageously demonstrate lower particulation during sputtering. The particles that are detrimentally ejected from the particle surface can be considered to be contaminants because these particles affect and reduce overall device yield. In some embodiments, the (uniform) macrodistribution of the brittle second phases provides a composite that has surprisingly been found to have greater compositional uniformity, thus providing sputtering targets that produce higher quality thin films. Also, the composites formed by the disclosed processes, in some cases, advantageously allow the production of larger diameter sputtering targets, which would be prone to cracking if produced by conventional methods.

Conventionally, it has been difficult to achieve a desirable (high) amount, if any, of ductile aluminum phase in higher scandium-containing alloys. This is because conventional production (casting) processes produce equilibrium microstructures with lower aluminum content and phase volume ratios predicted by the equilibrium phase diagram for aluminum-scandium. In contrast, by employing a non-equilibrium phase distribution as noted herein, the composites produced by processes disclosed herein achieve the desired amounts of ductile aluminum phase in the overall composition.

By judicious design of the phases present in the composite targets, the amount of ductile phase present relative to conventional equilibrium alloys, which either possess a small amount, if any, of free aluminum (alloys with less than 25% Sc) or no equilibrium aluminum (alloys with Sc contents greater than or equal to 25% Sc), can be beneficially increased, thereby increasing the ductility and strength of the material, improve the chemical uniformity, and reduce the amount of particulation that occurs during sputtering.

Macrostructure

The present disclosure relates to composites comprising aluminum and scandium—Al—Sc composites. The Al—Sc composites can be used to produce articles, such as sputtering targets, having, among other benefits, high compositional uniformity with a uniform distribution of second phase(s). In some embodiments, the Al—Sc composites contain from 1.0 at % to 65 at % scandium and from 35 at % to 99% aluminum (optionally along with other elements). Further compositional details are provided below.

Overall, the disclosed composite, in some embodiments, comprises from 1.0 at % to 65 at % scandium, e.g., from 5 at % to 55 at %, from 5 at % to 45 at %, from 10 v to 50 at %, from 15 at % to 45 at %, from 20 at % to 40 at %, from 1.0 at % to 5 at %, from 5 v to 10 at %, from 10 at % to 15 at %, from 15 at % to 20 at %, from 20 at % to 25 at %, from 25 at % to 30 at %, from 30 at % to 35 at %, from 35 at % to 40 at %, from 40 at % to 45 at %, from 45 at % to 50 at %, from 50 at % to 55 at %, from 55 at % to 60 at %, or from 60 at % to 65 at %.

In terms of lower limits, the composite may comprise greater than 1.0 at % scandium, e.g., greater than 5 at %, greater than 10 at %, greater than 15 at %, greater than 20 at %, greater than 25 at %, greater than 30 at %, greater than 35 at %, greater than 40 at %, greater than 45 at %, greater than 50 at %, greater than 55 at %, or greater than 60 at %. In terms of upper limits, the composite may comprise less than 65 at % scandium, e.g., less than 60 at %, less than 55 at %, less than 50 at %, less than 45 at %, less than 40 at %, less than 35 at %, less than 30 at %, less than 25 at %, less than 20 at %, less than 15 at %, less than 10 at %, or less than 5 at %.

As used herein, "greater than" and "less than" limits may also include the number associated therewith. Stated another way, "greater than" and "less than" may be interpreted as "greater than or equal to" and "less than or equal to." It is contemplated that this language may be subsequently modified in the claims to include "or equal to." For example, "greater than 4.0" may be interpreted as, and subsequently modified in the claims as "greater than or equal to 4.0."

In some embodiments, the composite comprises from 35 at % to 99 at % aluminum, e.g., from 40 at % to 95 at %, from 45 at % to 90 at %, from 50 at % to 80 at %, from 55 at % to 75 at %, from 60 at % to 75 at %, from 62 at % to 72 at %, from 35 at % to 40 at %, from 40 at % to 50 at %, from 50 at % to 55 at %, from 55 at % to 60 at %, from 60 at % to 65 at %, from 65 at % to 70 at %, from 70 at % to 75 at %, from 75 at % to 80 at %, from 80 at % to 85 at %, from 85 at % to 90 at %, from 90 at % to 95 at %, or from 95 at % to 99 at %. These amounts account for aluminum present in the first phase (as free aluminum) and as a component in the intermetallic second phase.

In terms of lower limits, the composite may comprise greater than 35 at % aluminum, e.g., greater than 40 at %, greater than 45 at %, greater than 50 at %, greater than 55 at %, greater than 60 at %, greater than 65 at %, greater than 70 at %, greater than 75 at %, greater than 80 at %, greater than 85 at %, greater than 90 at %, or greater than 95 at %. In terms of upper limits, the composite may comprise less than 99 at % aluminum, e.g., less than 95 at %, less than 90 at %, less than 85 at %, less than 80 at %, less than 75 at %, less than 70 at %, less than 65 at %, less than 60 at %, less than 55 at %, less than 50 at %, less than 45 at %, or less than 40 at %.

In some embodiments, the composite comprises from 1.0 mol % to 70 mol % scandium nitride, e.g., from 1 mol % to 5 mol %, from 5 mol % to 10 mol %, from 10 mol % to 15 mol %, from 20 mol % to 25 mol %, from 25 mol % to 30 mol %, from 30 mol % to 35 mol %, from 35 mol % to 40 mol %, from 40 mol % to 45 mol %, from 45 mol % to 50 mol %, from 50 mol % to 55 mol %, from 55 mol % to 60 mol %, from 60 mol % to 65 mol %, or from 65 mol % to 70 mol %. In terms of lower limits, the alloy may comprise greater than 1 mol % scandium nitride, e.g., greater than 5 mol %, greater than 10 mol %, greater than 15 mol %, greater than 20 mol %, greater than 25 mol %, greater than 30 mol %, greater than 35 mol %, greater than 40 mol %, greater than 45 mol %, greater than 50 mol %, greater than 55 mol %, greater than 60 mol %, or greater than 65 mol %. In terms of upper limits, the alloy may comprise less than 70 mol % scandium nitride, e.g., less than 65 mol %, less than 60 mol %, less than 55 mol %, less than 50 mol %, less than 45 mol %, less than 40 mol %, less than 35 mol %, less than 30 mol %, less than 25 mol %, less than 20 mol %, less than 15 mol %, less than 10 mol %, or less than 5 mol %.

Nitrided powders may be useful in controlling oxygen uptake and passivate the powder components to stabilize with the molten aluminum during processing.

In some cases, the composite is of high purity, and contains as few contaminants as possible. For example, oxygen is extremely deleterious to the properties of piezoelectric films, both by preferentially binding into the matrix and by stabilizing other, non piezoelectric phases. Thus, the composite or sputtering target should contain as little oxygen as possible. In some embodiments, the composite comprises less than 1500 ppm oxygen, e.g., less than 1000 ppm, less than 900 ppm, less than 800 ppm, less than 700 ppm, less than 600 ppm, less than 500 ppm, less than 400 ppm, less than 300 ppm, less than 200 ppm, or less than 100 ppm. The presence of transition metal elements, for example iron, should also be minimized.

In some embodiments, the uniformity of scandium across a surface of the composite, e.g., a sputtering target formed therefrom, varies by less than +/−0.5 at % scandium, e.g., less than +/−0.4 at %, less than +/−0.3 at %, less than +/−0.2 at %, less than +/−0.1 at %, or less than +/−0.05 at %, over the surface. In some embodiments, a sputtering target formed from the composites and having a central axis and a diameter intersecting the central axis through a thickness of the sputtering target, has a uniformity of scandium across the central axis and the diameter that varies by less than +/−0.5 at % scandium, e.g., less than +/−0.4 at %, less than +/−0.3 at %, less than +/−0.2 at %, less than +/−0.1 at %, or less than +/−0.05 at %.

Sputtering targets made from the composites may be used to deposit thin films onto a substrate. The piezoelectric properties of an individual device on the substrate are critically dependent upon the local stoichiometry of the film contained within an individual device. Hence the distribution of the scandium through an Al—Sc sputtering target should be as uniform as possible, both in-plane (e.g., on a surface) and through the thickness of the sputtering target. This chemical uniformity across both the surface and through the thickness is necessary because if the amount of scandium being sputtered from the target varies over the life of the target, the piezoelectric properties of the deposited film will change over the life of the target, resulting in device performance inconsistencies and resulting product yield loss. Properties and characteristics of the composite are discussed below.

Microstructure

In some embodiments, the composite comprises a ductile, first phase and a brittle, second phase dispersed throughout the matrix, and the second phase may comprise aluminum and scandium. The scandium present in the overall composite, in some cases, is provided by the second phase. In some cases, the second phase may include one or more compounds corresponding to the formula $Al_xSc_y$, where x is from 0 to 3 and y is from 1 to 2. The second phase may comprise $Al_3Sc$, $Al_2Sc$, AlSc, $Sc_2Al$, or Sc, or combinations thereof.

In some embodiments, the composite comprises from 5 vol % to 99 vol %, e.g., from 20 vol % to 99 vol %, first phase (free aluminum) and from 1 vol % to 80 vol % second phase, based on the total volume of the composite. For example, the composite may comprise from 5 vol % to 95 vol % first phase, e.g., from 40 vol % to 90 vol %, from 5 vol % to 50 vol %, from 5 vol % to 35 vol %, from 5 vol % to 25 vol %, from 10 vol % to 50 vol %, from 10 vol % to 40 vol %, from 10 vol % to 25 vol %, from 7 vol % to 50 vol %, from 7 vol % to 40 vol %, from 7 vol % to 30 vol %, from 7 vol % to 25 vol %, from 45 vol % to 85 vol %, from 50 vol % to 80 vol %, from 55 vol % to 75 vol %, or from 60 vol % to 70 vol %. In terms of lower limits, the composite may comprise greater than 5 vol % first phase, e.g., greater than 7 vol %, greater than 10 vol %, greater than 12 vol %, greater than 15 vol %, greater than 17 vol %, greater than 20 vol %, greater than 40 vol %, greater than 45 vol %, greater than 50 vol %, greater than 55 vol %, greater than 60 vol %, greater than 65 vol %, or greater than 70 vol %. In terms of upper limits, the composite may comprise less than 99 vol % first phase, e.g., less than 95 vol %, less than 90 vol %, less than 85 vol %, less than 80 vol %, less than 75 vol %, less than 70 vol %, less than 60 vol %, less than 50 vol %, less than 45 vol %, less than 40 vol %, less than 35 vol %, less than 30 vol %, less than 25 vol %, less than 20 vol %, less than 15 vol %, or less than 10 vol %.

The amount of first phase and second phases present may be quantitatively determined optical and SEM/EDS microscopy, EBSD, or other known techniques.

In some cases, the first phase may comprise a small amount of scandium, e.g., less than 1 wt %, less than 0.5 wt %, less than 0.2 wt %, or less than 0.1 wt %.

In some embodiments, the composite comprises from 1 vol % to 80 vol % second phase, e.g., from 5 vol % to 75 vol %, from 10 vol % to 70 vol %, from 15 vol % to 65 vol %, from 20 vol % to 60 vol %, from 25 vol % to 55 vol %, or from 30 vol % to 50 vol %. In terms of lower limits, the composite may comprise greater than 20 vol % second phase, e.g., greater than 1 vol %, greater than 5 vol %, greater than 10 vol %, greater than 15 vol %, greater than 20 vol %, greater than 25 vol %, greater than 30 vol %, or greater than 35 vol %. In terms of upper limits, the composite may comprise less than 80 vol % first phase, e.g., less than 75 vol %, less than 70 vol %, less than 65 vol %, less than 60 vol %, less than 55 vol %, or less than 50 vol %. These amounts are generally lower than amounts used in conventional alloys because the disclosed second phases have higher scandium content than conventional alloys that use an equilibrium phase distribution, as determined by the equilibrium phase diagram. Thus, the lower amounts can be used to achieve the overall scandium level. Because lower amounts of second phases are employed, it is possible to advantageously utilize higher amounts of ductile aluminum phase.

FIG. 1 is the phase diagram 50 for aluminum and scandium. The x-axis indicates the amount of scandium in atomic percent (at %), with zero scandium/100 at % aluminum at the far left of the phase diagram. Examination of the Al—Sc phase diagram reveals that from 0 to 25 at % scandium, the equilibrium alloy may include an intermetallic $Al_3Sc$ phase in a metallic aluminum matrix. At higher scandium content, the composite may include one or more intermetallic phases selected from $Al_3Sc$, $Al_2Sc$, AlSc, Al $Sc_2$, or may include scandium, or may include any combination of intermetallic phases and scandium.

The second phase in the composite comprises high amounts/concentrations of scandium, e.g., amounts/concentrations that are outside of, e.g., greater than, the amounts/concentrations predicted by the equilibrium phase diagram for aluminum-scandium. For example, the second phase may comprise greater than (or equal to) 25 at %, based on the total of the second phase e.g., greater than 28 at %, greater than 30 at %, greater than 33 at %, greater than 35 at %, greater than 40 at %, greater than 45 at %, greater than 50 at %, greater than 55 at %, greater than 65 at %, greater than 66 at %, greater than 70 at %, greater than 75 at %, greater than 80 at %, greater than 85 at %, or greater than 90 at %.

The second phase comprises specific intermetallic phases, e.g., $Al_3Sc$, $Al_2Sc$, AlSc, Al $Sc_2$, e.g., in amounts that are outside of the amounts/concentrations predicted by the equilibrium phase diagram for aluminum-scandium. For example, the second phase may comprise these intermetallic phases in an amount greater than 5 mol %, based on the total of the second phase e.g., greater than 10 mol %, greater than 15 mol %, greater than 20 mol %, greater than 25 mol %, greater than 30 mol %, greater than 35 mol %, greater than 40 mol %, greater than 45 mol %, greater than 50 mol %, greater than 55 mol %, greater than 60 mol %, or greater than 65 mol %. In terms of upper limits, the second phase may comprise these intermetallic phases in an amount less than 95 mol %, e.g., less than 90 mol %, less than 85 mol %, less than 80 mol %, less than 75 mol %, less than 70 mol %, less than 65 mol %, less than 60 mol %, less than 60 mol %, less than 55 mol %, less than 50 mol %, less than 45 mol %, less than 40 mol %, less than 35 mol %, less than 30 mol %, or less than 25 mol %.

In some embodiments, these amounts/concentrations are outside of, e.g., greater than, the amounts/concentrations predicted by the equilibrium phase diagram for aluminum-scandium.

In some embodiments, intermetallic phases having greater amounts/concentrations of scandium and/or lesser amounts of aluminum may be utilized. For example, the second phase may comprise $Al_3Sc$, $Al_2Sc$, AlSc, Al $Sc_2$, or Sc or combinations thereof in an amount greater than 1 mol %, based on the total moles of the second phase, e.g., greater than 2 mol %, greater than 5 mol %, greater than 10 mol %, greater than 15 mol %, greater than 20 mol %, greater than 25 mol %, greater than 30 mol %, greater than 35 mol %, greater than 40 mol %, greater than 45 mol %, greater than 50 mol %, greater than 55 mol %, greater than 60 mol %, or greater than 65 mol %. In some embodiments, these amounts/concentrations are outside of, e.g., greater than, the amounts/concentrations predicted by the equilibrium phase diagram for aluminum-scandium. These ranges and limits are applicable to the intermetallic phases collectively and to each of the intermetallic phases individually.

It has been discovered that some second phase components are particularly brittle, which may be an overall detriment to the compositions. In some embodiments, the second phase comprises specific amounts of intermetallic phases, e.g., $Al_2Sc$. For example, the second phase may comprise less than 60 mol % $Al_2Sc$, based on the total moles of the second phase, e.g., less than 55 mol %, less than 50 mol %, less than 40 mol %, less than 30 mol %, less than 20 mol %, less than 10 mol %, or less than 5 mol %. In some embodiments, the second phase is devoid of or substantially devoid of $Al_2Sc$.

The second phase comprises low amounts/concentrations, if any, of aluminum, e.g., amounts/concentrations that are outside of the amounts/concentrations predicted by the equilibrium phase diagram for aluminum-scandium. For example, the second phase may comprise less than (or equal to) 75 at %, based on the total of the second phase e.g., less than 70 at %, less than 66 at %, less than 65 at %, less than 60 at %, less than 55 at %, less than 50 at %, less than 45 at %, less than 40 at %, or less than 35 at %.

In some cases, the amount of scandium in the second phase is greater than the amount predicted by the equilibrium phase diagram for aluminum-scandium, e.g., at least 1% greater, at least 2% greater, at least 5% greater, at least 10% greater, at least 15% greater, at least 20% greater, at least 25% greater, at least 35% greater, at least 50% greater, at least 75% greater, or at least 100%.

Figure 2:
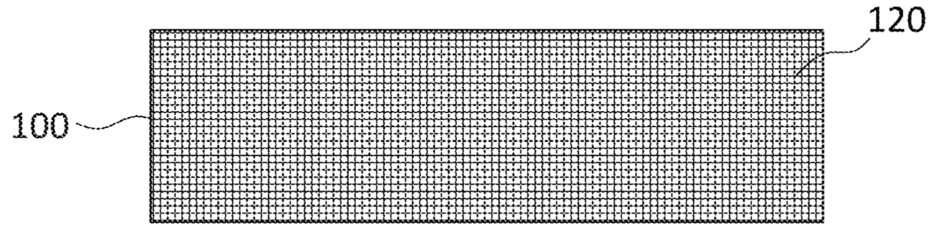
FIG. 2 is a schematic cross-section showing a conventional aluminum matrix.
Figure 3A:
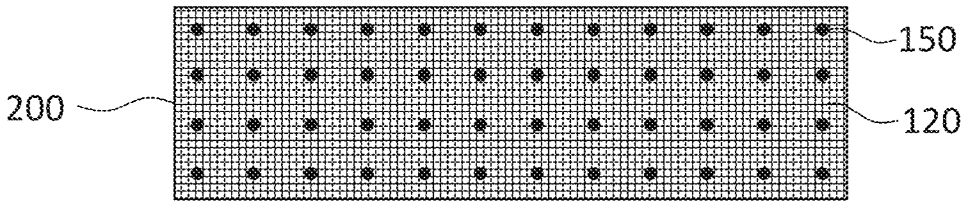
FIG. 3A is a schematic cross-section showing an exemplary microstructure for Al—Sc alloys having a second phase.
Figure 3B:
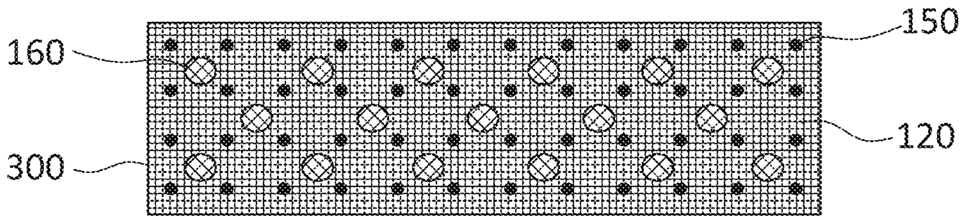
FIG. 3B is a schematic cross-section showing an exemplary microstructure for Al—Sc alloys having a first second phase and a second phase.
Figures 4A, 4B, 4C, 4D, 4E:
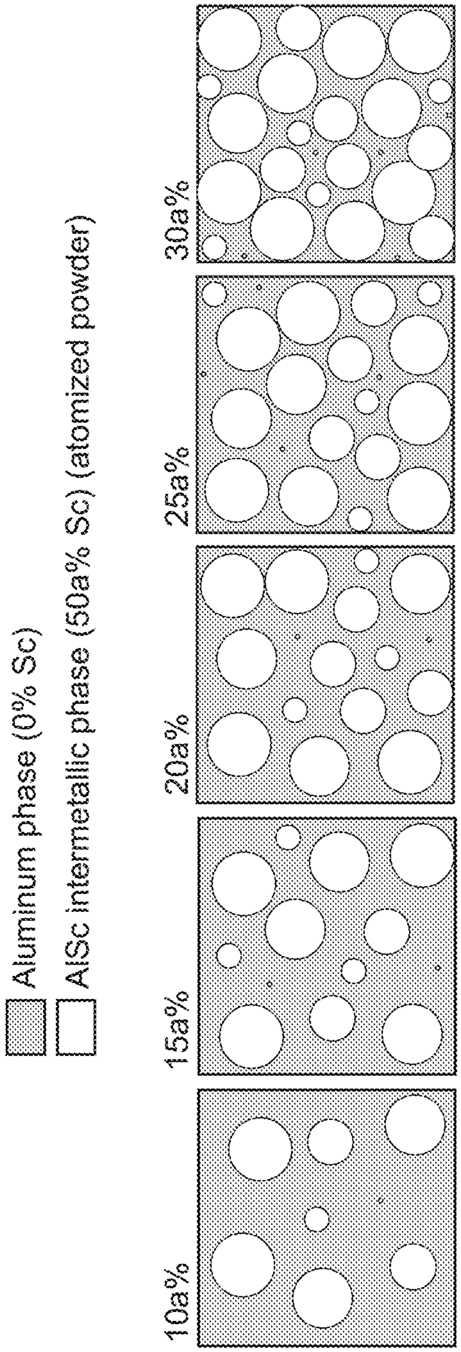
FIGS. 4A-E are representations showing the microstructure of an Al—Sc alloy (with multiple phases indicated).

FIGS. 3A-3B represent schematic cross-sections of Al—Sc alloy microstructures, while FIG. 2 represents a conventional aluminum alloy 100 having an aluminum rich metal matrix 120 with no second phases present. FIG. 3A represents an Al—Sc alloy 200 according to the present disclosure that may include a second phase 150 dispersed uniformly throughout the aluminum matrix 120. In some cases, the second phase as described above may be distributed at a spatial distance $d_1$ apart, which may include a range of values.

The second phase, in some embodiments, may comprise multiple individual phases, e.g., a second phase and a third phase and a fourth phase. It is intended that phases higher than the second phase, e.g., the third phase, the fourth phase, etc., shall have the same description and properties as mentioned above with regard to the second phase. For example the third phase may have high amounts scandium content, e.g., amounts that are outside of the amounts predicted by the equilibrium phase diagram for aluminum-scandium.

For example, FIG. 3B shows another Al—Sc composite 300 according to the present disclosure that includes second phase 150 and third phase 160 dispersed uniformly throughout the first phase 120. Phases 150 and 160 may be as described herein. Not shown, composites according to the present disclosure may include more than four phases, e.g., five phases or six phases, with each phase being dispersed throughout the first phase.

In some embodiments, the first phase grains and the second phase grains each have an average particle size, which may be measured in accordance with ASTM E112 (current year).

In some embodiments, the first phase is characterized as having an average particle size ranging from 2 μm to 200 μm, e.g., from 10 μm to 150 μm, from 15 μm to 125 μm, from 20 μm to 100 μm, from 25 μm to 75 μm, from 2 μm to 40 μm, from 2 μm to 20 μm, from 4 μm to 12 μm, from 10 μm to 100 μm, from 20 μm to 80 μm, from 30 μm to 70 μm, or from 40 μm to 70 μm.

In terms of lower limits, the first phase may be characterized as having an average particle size greater than 2 μm, e.g., greater than 4 μm, greater than 10 μm, greater than 20 μm, greater than 25 μm, greater than 30 μm, greater than 40 μm or greater than 50 μm. In terms of upper limits, the first phase is characterized as having an average particle size less than 200 μm, e.g., less than 150 μm, less than 125 μm, or less than 100 μm, less than 80 μm, less than 75 μm, less than 70 μm, less than 40 μm, less than 20 μm, or less than 12 μm, In some embodiments, the grains of the first aluminum matrix phase are characterized as having a crystallographic orientation of (110). In other embodiments, the grains of the first aluminum matrix phase are characterized as having no preferred crystallographic orientation, or as having random texture. In some cases, texture may be quantified via XRD peak height ratios, EBSD volume ratios, EBSD texture analysis MRD values, and/or XRD pole-figure MRD values.

In some embodiments, the grains of the first phase are characterized as having a random crystallographic orientation.

The second phase may be desirably as fine as possible, and more specifically with an average particle size of less than 100 microns (μm). In some embodiments, the second phase(s) is characterized as having an average particle size ranging from 0.5 μm to 500 μm, e.g., from 1 μm to 450 μm, e.g., from 10 μm to 400 μm, from 50 μm to 400 μm, from 100 μm to 350 μm, or from 200 μm to 300 μm. In terms of lower limits, the second phase(s) is characterized as having an average particle size greater than 0.5 μm, e.g., greater than 1 μm, greater than 10 μm, greater than 50 μm, greater than 100 μm, or greater than 200 μm. In terms of upper limits, the second phase(s) is characterized as having an average particle size less than 500 μm, e.g., less than 400 μm, less than 350 μm, less than 300 μm, or less than 250 μm.

In some cases, the microstructure of the sputtering target is uniform over the entire surface area of the target (typically a disk that is 5 inches to 18 inches in diameter, or about 125 mm to about 450 mm) and through its full thickness (typically approximately one-quarter inch, or ¼ inch, or about 6 mm to about 7 mm). The scale of the microstructure in the sputtering target is also significant. Defects such as microcracks and fissures, pores, refractory or dielectric inclusions, oxide inclusions, and large intermetallic phase grains are typically associated with undesirable events such as microarcing and particulation, and are extremely deleterious to the properties of the films and should be avoided.

In some embodiments, the aluminum-scandium composites have a microstructure devoid of or substantially devoid of microcracks and fissures. The microcracks and fissures may be determined using optical/SEM metallography.

In some embodiments, the aluminum-scandium composites have a microstructure devoid of or substantially devoid of porosity. As measured, the composite comprises less than 3% porosity, e.g., less than 2%, less than 1%, less than 0.9%, less than 0.8%, less than 0.7%, less than 0.6%, less than 0.5%, less than 0.4%, less than 0.3%, less than 0.2%, or less than 0.1%.

In some embodiments, the aluminum-scandium alloys have a microstructure devoid of or substantially devoid of oxide inclusions.

Microscopy may be employed to quantify the aforementioned measurements.

In some embodiments, the aluminum-scandium composite sputtering target has a diameter or cross measurement of greater than 125 mm, e.g., greater than 150 mm, greater than 200 mm, greater than 300 mm, greater than 350 mm, or greater than 400 mm.

The aluminum-scandium composite sputtering target may have a thickness, e.g., height, ranging from 1 mm to 50 mm, e.g., from 1 mm to 40 mm, 2 mm to 35 mm, 2 mm to 25 mm, from 3 mm to 15 mm, or from 5 mm to about 10 mm.

Process

A process for producing a (non-equilibrium) aluminum-scandium composite as disclosed herein. In some embodiments, the process comprises the steps of providing a second phase powder comprising a compound corresponding to the formula $Al_xSc_y$, where x is from 0 to 3 and y is from 1 to 2; and mixing the powder with a first phase (powder) comprising aluminum to form a composite precursor. The process may further comprise the step of applying at least one of heat or pressure to the composite precursor to consolidate the materials, e.g., the first and second phase powders. The process further comprises the step of cooling the consolidated composite precursor to form the non-equilibrium composite.

In some cases, temperatures in the range of from 300° C. to 900° C. are employed, e.g., from 350° C. to 850° C., from 400° C. to 800° C., or from 500° C. to 700° C. In terms of lower limits, temperatures of greater than 300° C. may be employed, e.g., greater than 350° C., greater than 400° C., or greater than 500° C. In terms of upper limits, temperatures of less than 900° C. may be employed, e.g., less than 850° C., less than 800° C., or less than 700° C.

In some cases, pressures in the range of from 3000 kPa to 11000 kPa are employed, e.g., from 4000 kPa to 10000 kPa, from 5000 kPa to 9000 kPa, or from 6000 kPa to 8000 kPa. In terms of lower limits, pressures of greater than 3000 kPa may be employed, e.g., greater than 4000 kPa, greater than 5000 kPa, or greater than 6000 kPa. In terms of upper limits, pressures of less than 11000 kPa may be employed, e.g., less than 10000 kPa, less than 9000 kPa, or less than 8000 kPa.

In some embodiments, e.g., when rapid cooling is employed for example in a squeeze casting process, the cooling of the composite may be at a rate of greater than 1° C./per minute, e.g., greater than 5° C./per minute, greater than 10° C./per minute, greater than 20° C./per minute, greater than 25° C./per minute, or greater than 35° C./per minute.

In some cases, by using a cooling step, the amount of the non-phase diagram intermetallic phases in the second phase is kept in the first phase matrix, without having a chance to revert back to equilibrium phases and/or amounts. In some embodiments, by using a cooling step, the non-equilibrium phase mixture is maintained, without having a chance to revert back to the equilibrium phase mixture.

In some embodiments, the scandium-aluminum composites described herein can be formed via casting processes, preferably employing aluminum (first phase) powder and intermetallic (second phase) powder. Melt processing, e.g. via a casting route, also produces composites with much lower oxygen contents than powder processing, e.g., less than 1000 ppm, less than 800 ppm, less than 600 ppm, less than 400 ppm, less than 300 ppm, less than 200 ppm, or less than 100 ppm. Thus, casting of aluminum-scandium alloys is suitable for fabrication of the disclosed composites. In some cases, e.g., when using casting techniques, free aluminum is increased/maintained by keeping the temperatures below a certain lever. By keeping temperatures within these ranges and limits, formation of unwanted metallic phase components is advantageously avoided/minimized.

In a typical casting process, the composite constituents are melted together in a crucible at an elevated temperature and then poured into a mold where the molten composite solidifies into an ingot. Solidification typically proceeds from the bottom and walls of the mold towards the center, therefore it would be expected that the outermost regions would cool much faster than the central portions of the casting.

In some cases, a high cooling rate of a casting with large intermetallic loading will cause the buildup of large internal stresses, which can cause the casting to crack. In addition, many cast composites are subjected to subsequent thermomechanical processing (e.g. plastic deformation and/or heat treatment) to break down the characteristic structures associated with casting and yield a uniform microstructure through the target thickness. Brittle castings generally do not withstand such thermomechanical processing steps very well. However, the disclosed composites may be able to withstand this processing due to the composition thereof.

EXAMPLES

Example 1

To produce a composite sputtering target of Example 1, an intermetallic (second phase) $Al_{47}Sc_{53}$ powder comprising multiple intermetallic aluminum-scandium phases was prepared. Al Sc and Sc were blended in a Turbula® mixer for 10 minutes to form a precursor. The precursor was loaded into a 5 inch graphite die and hot pressed to consolidate. The consolidated precursor was heated and pressed at 600° C. and 1000 psi, respectively, for approximately 4 hours. The formed precursor was removed at room temperature and cooled. 200 grams of the cooled precursor were crushed together with 50 grams of (free) aluminum powder to form the sputtering target composition precursor, which was processed further to yield the sputtering target composition. The overall (free) aluminum content was approximately over 20 at %, and the overall scandium content was approximately 40 at %. These percentages are outside the amounts predicted by the equilibrium phase diagram for aluminum-scandium.

Comparative Example A

A comparative intermetallic powder of Comparative Example A was prepared by alloying 145 grams of aluminum and 105 grams of scandium. These components were alloyed at approximately 1450° C. under vacuum to form a precursor. The precursor was cast using a mold in a conventional casting process, then cooled to room temperature.

The overall alloyed aluminum content and the overall alloyed scandium content were consistent with the amounts predicted by the equilibrium phase diagram for aluminum-scandium.

TABLE 1

| | Target Composition | |
|---|---|---|
| | Ex. 1 | Comp. Ex. A |
| Al (free), total | At least 20 vol %, e.g., 24 vol % | none |
| Sc | | some |
| Al3Sc | 48 wt % | >48 wt % |
| Al3Sc | Small amt. (<60 mol % of total second phase ) | Significant amt. (>60 mol % of total second phase) |
| AlSc | 28 wt % | >28 wt % |

As shown in Table 1, the target of Example 1 showed a high content of (free) aluminum and a low content of intermetallic phase, e.g., $Al_2Sc$. Because of the high free aluminum/low $ScAl_2$ content, the sputtering target should demonstrate superior ductility.

FIGS. 4A-E are exemplary representations showing the microstructure of an Al—Sc alloy (with multiple phases indicated). The circular dots indicate the second intermetallic phase, which contains scandium, e.g., $ScAl_3$, $ScAl_2$, ScAl, $Sc_2Al$, Sc, or combinations thereof, and the remaining area represents the (first) free aluminum phase. Representations for 10 at %, 15 at %, 20 at %, 25 at % and 30 at % scandium in the overall composition are shown.

Figure 5C:
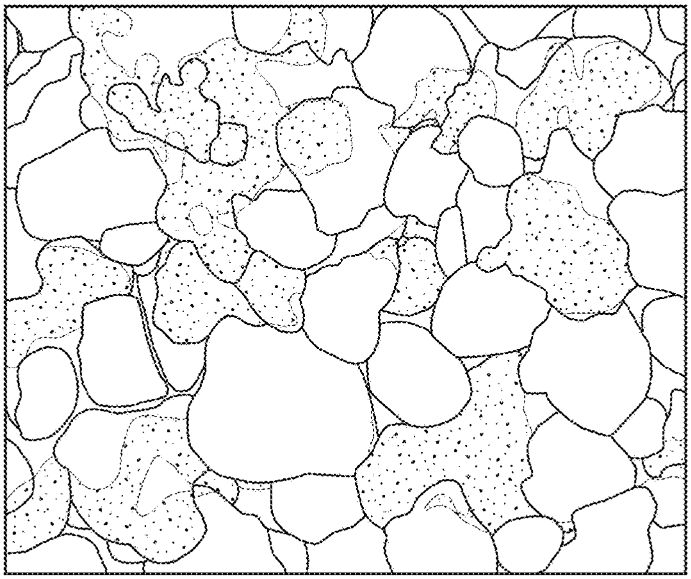
FIGS. 5A-C are representations of SEM photographs showing the microstructure of an Al—Sc alloy (with elemental distribution indicated).
Figure 5B:
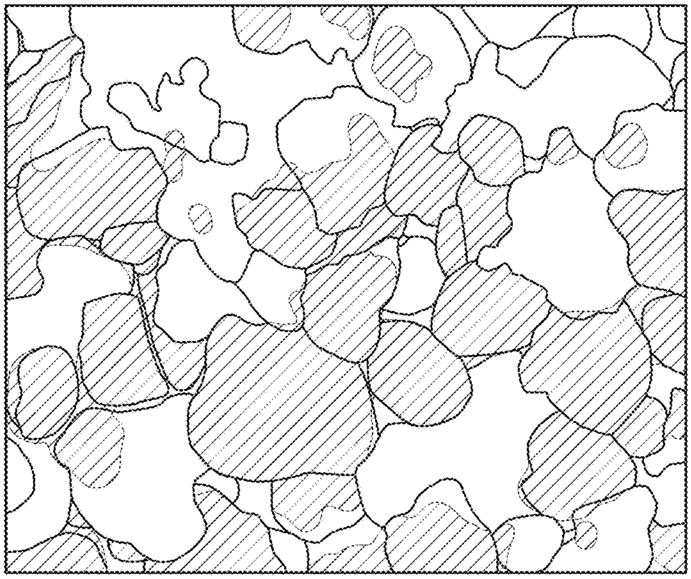
Figure 5A:
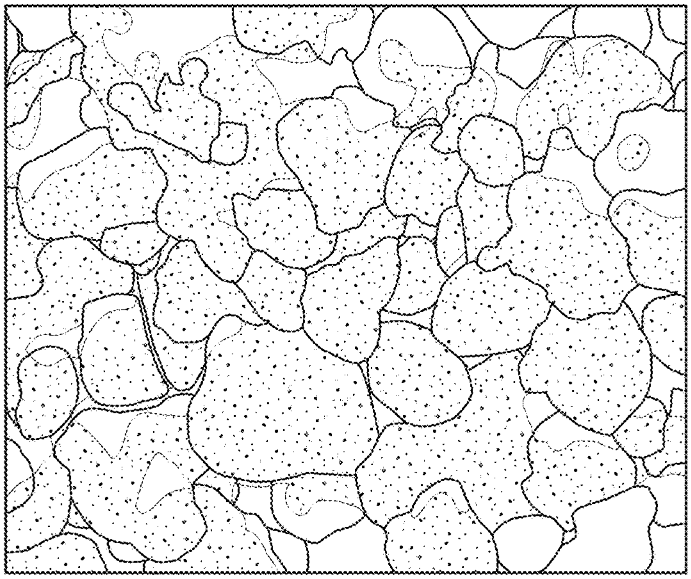

FIGS. 5A-C are representations of SEM photographs that show the microstructure of an Al—Sc alloy. FIG. 5A shows the microstructure that has been EDS mapped to indicate aluminum content, e.g., free aluminum and/or aluminum-containing intermetallic, see flecked area. FIG. 5B shows the microstructure that has been EDS mapped to indicate scandium content, e.g., scandium-containing intermetallic phase (s), see diagonally-lined area. FIG. 5C shows the microstructure that has been EDS mapped to indicate free aluminum content. Area that shows both aluminum presence and scandium presence indicates intermetallic (second phase) content. Free aluminum content (first phase) is represented by the area in FIG. 5C that contains aluminum, but does not contain scandium (scandium presence is indicated shown in FIG. 5B), see flecked areas in FIG. 5C. The areas of free aluminum (first phase) were analyzed and calculated to represent approximately 15 vol % to 40 vol % of the total alloy.

Figure 6:
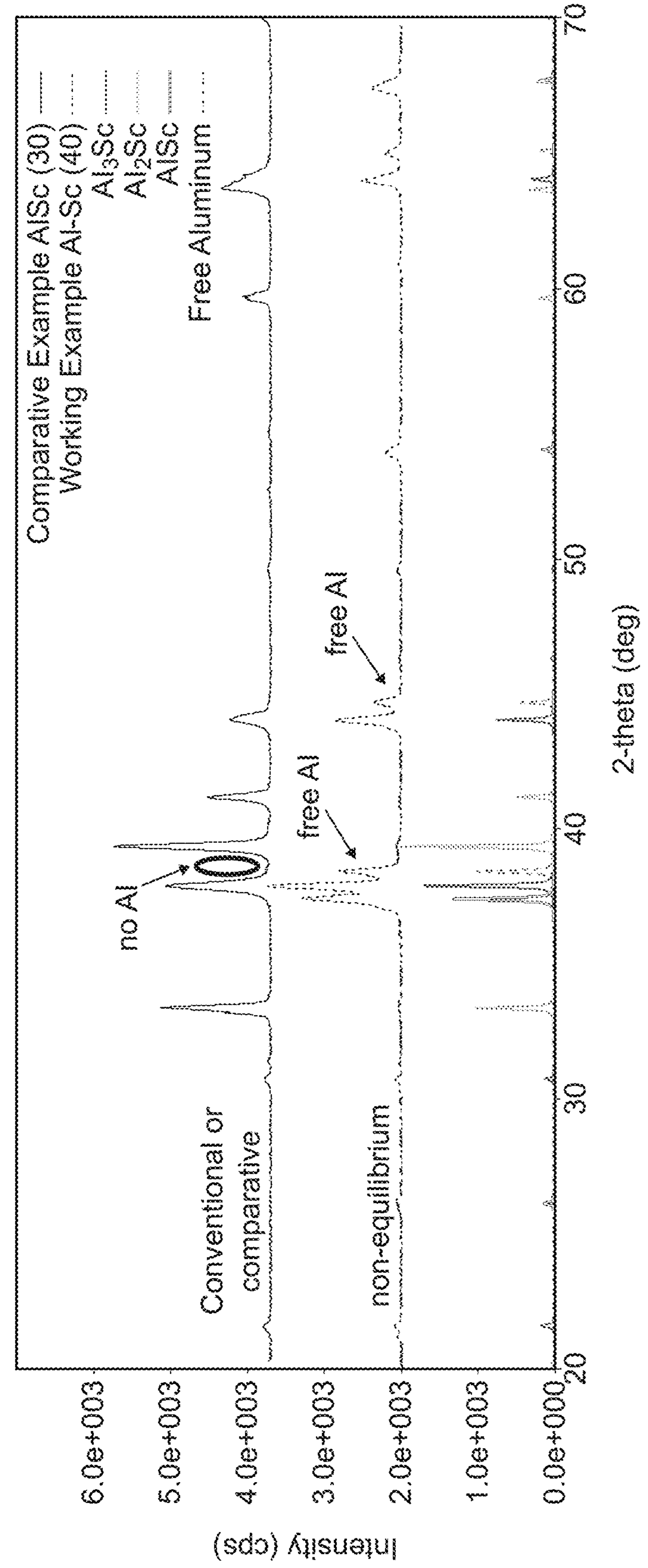
FIG. 6 is a collection of X-ray diffraction plots showing metal content for the respective components of a conventional Al—Sc alloy and an Al—Sc alloy in accordance with an embodiment of the disclosure.

FIG. 6 is an X-ray diffraction plot showing metal content for the respective components of a comparative Al—Sc alloy and of a working example. As shown in the top plot for the comparative example, peaks are indicated for intermetallic phases, e.g., $Al_2Sc$ and $Al_3Sc$, and no peaks associated with free aluminum peak are indicated. In contrast, the middle plot shows free aluminum peaks at approximately 38 and 45 degrees for the working example. These peaks indicate significant free aluminum content, which is advantageous. The bottom plot shows the peaks for all of the individual components for the working example including the peaks indicated in the middle plot as well as intermetallic phase(s). The peaks were analyzed and extrapolated to calculate volume percentages. Volume percentage of free aluminum (first phase) in the working example was calculated to be approximately 15 vol % to 40 vol % of the total composition.

EMBODIMENTS

The following embodiments are contemplated. All combinations of features and embodiments are contemplated.

Embodiment 1: an Al—Sc composite comprising from 1.0 at % to 65 at % scandium and from 35 at % to 99 at % aluminum, having a microstructure including a first phase and a second phase dispersed therethrough, the second phase comprising a compound corresponding to the formula $Al_xSc_y$, where x is from 0 to 3 and y is from 1 to 2.

Embodiment 2: an Al—Sc composite sputtering target comprising from 1.0 at % to 65 at % scandium and from 35 at % to 99 at % aluminum, having a microstructure including a first phase and a second phase dispersed therethrough, the second phase comprising a compound corresponding to the formula $Al_xSc_y$, where x is from 0 to 3 and y is from 1 to 2.

Embodiment 3: an embodiment of embodiment 1 or 2 wherein the second phase comprises $ScAl_3$, $ScAl_2$, ScAl, $Sc_2Al$, or Sc, or combinations thereof.

Embodiment 4: an embodiment of any of embodiments 1-3 wherein the second phase comprises $ScAl_2$, ScAl, $Sc_2Al$, or Sc, or combinations thereof.

Embodiment 5: an embodiment of any of embodiments 1-4 wherein the microstructure includes from 5 vol % to 99 vol %, e.g., 20 vol % to 99 vol %, of the first phase and from 1% to 80 vol % of the second phase as determined by quantitative image analysis.

Embodiment 6: an embodiment of any of embodiments 1-5 wherein the concentration of scandium in the second phase is greater than the concentration predicted by the equilibrium phase diagram for aluminum-scandium.

Embodiment 7: an embodiment of any of embodiments 1-6 wherein the concentration of scandium in the second phase is at least 1% greater than the concentration predicted by the equilibrium phase diagram for aluminum-scandium.

Embodiment 8: an embodiment of any of embodiments 1-7 wherein the second phase comprises greater than 25 at % scandium.

Embodiment 9: an embodiment of any of embodiments 1-8 wherein the second phase comprises greater than 1 mol % of $Al_2Sc$, AlSc, Al $Sc_2$, or Sc or combinations thereof.

Embodiment 10: an embodiment of any of embodiments 1-9 wherein the second phase comprises less than 85 mol % aluminum.

Embodiment 11: an embodiment of any of embodiments 1-10 wherein the second phase further comprises from 1.0 mol % to 70 mol % scandium nitride.

Embodiment 12: an embodiment of any of embodiments 1-11 wherein grains of the first aluminum matrix phase are characterized by a crystallographic orientation of (110).

Embodiment 13: an embodiment of any of embodiments 1-12 wherein grains of the first aluminum matrix phase are characterized by a random crystallographic orientation.

Embodiment 14: an embodiment of any of embodiments 1-13 wherein the second phase is characterized as having a particle size ranging from 0.5 microns to 500 microns.

Embodiment 15: an embodiment of any of embodiments 1-14 wherein the microstructure is substantially devoid of microcracks and fissures.

Embodiment 16: an embodiment of any of embodiments 1-15 wherein the microstructure is substantially devoid of oxide inclusions.

Embodiment 17: an embodiment of any of embodiments 1-16 wherein the composite or sputtering target further comprises less than 1000 ppm of oxygen, preferably less than 400 ppm, or more preferably less than 100 ppm.

Embodiment 18: an embodiment of any of embodiments 1-17 wherein the uniformity of scandium across a surface of the sputtering target varies by less than +/−0.5 at % scandium over an entire radius of the surface.

Embodiment 19: an embodiment of any of embodiments 1-18 with the sputtering target having a central axis and a diameter intersecting the central axis through a thickness of the sputtering target, wherein the uniformity of scandium across the central axis and the diameter varies by less than +/−0.5 wt % scandium.

Embodiment 20: an embodiment of any of embodiments 1-19 wherein the sputtering target has a diameter of greater than 300 mm.

Embodiment 21: a process for producing a non-equilibrium composite, the process comprising: providing a second phase powder comprising a compound corresponding to the formula $Al_xSc_y$, where x is from 0 to 3 and y is from 1 to 2; mixing the powder with a first phase comprising aluminum to form a composite precursor; applying at least one of heat or pressure to the composite precursor to consolidate the materials and cooling the consolidated composite precursor to form the non-equilibrium composite.

Embodiment 22: an embodiment of embodiment 21 wherein the compound comprises $Al_2Sc$, AlSc, Al $Sc_2$, or Sc, or combinations thereof, present in an amount greater than 1 mol %.

While the invention has been described in detail, modifications within the spirit and scope of the invention will be readily apparent to those of skill in the art. In view of the foregoing discussion, relevant knowledge in the art and references discussed above in connection with the Background and Detailed Description, the disclosures of which are all incorporated herein by reference. In addition, it should be understood that aspects of the invention and portions of various embodiments and various features recited below and/or in the appended claims may be combined or interchanged either in whole or in part. In the foregoing descriptions of the various embodiments, those embodiments which refer to another embodiment may be appropriately combined with other embodiments as will be appreciated by one of skill in the art. Furthermore, those of ordinary skill in the art will appreciate that the foregoing description is by way of example only, and is not intended to limit.

We claim:

1. An Al—Sc composite comprising from 1.0 at % to 65 at % scandium (Sc) and from 35 at % to 99 at % aluminum (Al), having a microstructure including a first aluminum matrix phase and a second phase dispersed therethrough, the second phase comprising a compound corresponding to the formula $Al_xSc_y$, where x is from 0 to 3 and y is from 1 to 2; wherein the concentration of scandium in the second phase is at least 1% greater than the concentration predicted by the equilibrium phase diagram for aluminum-scandium.

2. The composite of claim 1, wherein the second phase comprises $Al_3Sc$, $Al_2Sc$, AlSc, $AlSc_2$, Sc, or combinations thereof.

3. The composite of claim 1, wherein the second phase comprises less than 60 mol % $Al_2Sc$, based on the total moles of the second phase.

4. The composite of claim 1, wherein the composite comprises at least 5 vol % of the first aluminum matrix phase as determined by quantitative image analysis.

5. The composite of claim 1, wherein the microstructure includes from 20 vol % to 99 vol % of the first aluminum matrix phase and from 1% to 80 vol % of the second phase as determined by quantitative image analysis.

6. The composite of claim 1, wherein the concentration of scandium in the second phase is greater than the concentration predicted by the equilibrium phase diagram for aluminum-scandium.

7. The composite of claim 1, wherein the second phase comprises greater than 25 at % scandium.

8. The composite of claim 1, wherein the second phase comprises greater than 1 mol % of $Al_2Sc$, AlSc, $AlSc_2$, or Sc or combinations thereof.

9. The composite of claim 1, wherein the second phase comprises less than 85 mol % aluminum.

10. The composite of claim 1, wherein the second phase further comprises from 1.0 mol % to 70 mol % scandium nitride (ScN).

11. The composite of claim 1, wherein grains of the first aluminum matrix phase are characterized by a crystallographic orientation of (110).

12. The composite of claim 1, wherein grains of the first aluminum matrix phase are characterized by a random crystallographic orientation.

13. The composite of claim 1, wherein the second phase is characterized as having a particle size ranging from 0.5 microns to 500 microns.

14. The composite of claim 1, wherein the microstructure is substantially devoid of microcracks, fissures, and oxide inclusions.

15. The composite of claim 1, wherein the composite is a sputtering target comprising less than 1000 ppm of oxygen.

16. A process for producing a non-equilibrium composite, as recited in claim 1 the process comprising:
- providing a second phase powder comprising a compound corresponding to the formula $Al_xSc_y$, where x is from 0 to 3 and y is from 1 to 2;
- mixing the powder with a first phase comprising aluminum to form a composite precursor;
- applying at least one of heat or pressure to the composite precursor to consolidate the materials; and
- cooling the consolidated composite precursor to form the non-equilibrium composite;
- wherein the concentration of scandium in the second phase is at least 1% greater than the concentration predicted by the equilibrium phase diagram for aluminum-scandium.

17. The process of claim 16, wherein the compound comprises $Al_3Sc$, $Al_2Sc$, AlSc, $AlSC_2$, Sc, or combinations thereof, present in an amount greater than 1 mol %, and free aluminum, present in an amount greater than 20 vol %.

18. An Al—Sc composite sputtering target comprising from 1.0 at % to 65 at % scandium (Sc) and from 35 at % to 99 at % aluminum (Al), having a microstructure including a first aluminum matrix phase and a second phase dispersed therethrough, the second phase comprising a compound corresponding to the formula $Al_xSc_y$, where x is from 0 to 3 and y is from 1 to 2; wherein the concentration of scandium in the second phase is at least 1% greater than the concentration predicted by the equilibrium phase diagram for aluminum-scandium.

19. The sputtering target of claim 18, wherein the uniformity of scandium across a surface of the sputtering target varies by less than +/−0.5 at % scandium over an entire radius of the surface.

20. An Al—Sc composite comprising from 1.0 at % to 65 at % scandium (Sc) and from 35 at % to 99 at % aluminum (Al), having a microstructure including a first aluminum matrix phase and a second phase dispersed therethrough, the second phase comprising a compound corresponding to the formula $Al_xSC_y$, where x is from 0 to 3 and y is from 1 to 2, wherein the second phase further comprises from 1.0 mol % to 70 mol % scandium nitride (ScN).

21. A process for producing a non-equilibrium composite, as recited in claim 20 the process comprising:
- providing a second phase powder comprising a compound corresponding to the formula $Al_xSc_y$, where x is from 0 to 3 and y is from 1 to 2;
- mixing the powder with a first phase comprising aluminum to form a composite precursor;
- applying at least one of heat or pressure to the composite precursor to consolidate the materials; and
- cooling the consolidated composite precursor to form the non-equilibrium composite;
- wherein the second phase further comprises from 1.0 mol % to 70 mol % scandium nitride (ScN).

22. An Al—Sc composite sputtering target comprising from 1.0 at % to 65 at % scandium (Sc) and from 35 at % to 99 at % aluminum (Al), having a microstructure including a first aluminum matrix phase and a second phase dispersed therethrough, the second phase comprising a compound corresponding to the formula $Al_xSc_y$, where x is from 0 to 3 and y is from 1 to 2; wherein the second phase further comprises from 1.0 mol % to 70 mol % scandium nitride (ScN).

* * * * *